United States Patent
Yamamoto

[11] Patent Number: 6,090,681
[45] Date of Patent: Jul. 18, 2000

[54] METHOD OF FORMING AN HSG CAPACITOR LAYER VIA IMPLANTATION

[75] Inventor: Ichiro Yamamoto, Tokyo, Japan

[73] Assignee: NEC Corporation, Tokyo, Japan

[21] Appl. No.: 09/064,067

[22] Filed: Apr. 22, 1998

[30] Foreign Application Priority Data

Apr. 22, 1997 [JP] Japan ..................... 9-104551

[51] Int. Cl.[7] ..................... H01L 21/20; H01L 27/108
[52] U.S. Cl. ..................... 438/398; 257/309; 438/532
[58] Field of Search ..................... 438/253, 254, 438/255, 398; 257/309

[56] References Cited

U.S. PATENT DOCUMENTS

| | | | |
|---|---|---|---|
| 4,904,611 | 2/1990 | Chiang et al. | 438/479 |
| 5,385,863 | 1/1995 | Tatsumi et al. | 437/109 |
| 5,569,936 | 10/1996 | Zhang et al. | 257/66 |
| 5,858,837 | 1/1999 | Sakoh et al. | 438/255 |

FOREIGN PATENT DOCUMENTS

| | | | |
|---|---|---|---|
| 0 308 166 | 3/1989 | European Pat. Off. | |
| 0308166 A2 | 3/1989 | European Pat. Off. | H01L 21/20 |
| 0 521 644 | 1/1993 | European Pat. Off. | |
| 0521644 A1 | 1/1993 | European Pat. Off. | H01L 21/3205 |
| 2 314 683 | 1/1998 | United Kingdom | H01L 21/8242 |

Primary Examiner—Olik Chaudhuri
Assistant Examiner—William David Coleman
Attorney, Agent, or Firm—Sughrue, Mion, Zinn, Macpeak & Seas, PLLC

[57] ABSTRACT

In manufacturing a semiconductor device, an amorphous silicon layer with a predetermined thickness to be electrically connected to a silicon substrate is formed on a silicon oxide film formed on the silicon substrate. The interface between the silicon oxide film and the amorphous silicon layer is mixed by implanting ions through the amorphous silicon layer. Nuclei are formed on the surface of the amorphous silicon layer by annealing of the amorphous silicon layer and irradiation of a predetermined material. Convexities are formed on the surface of the amorphous silicon layer using the nuclei as centers by annealing the amorphous silicon layer having the nuclei.

14 Claims, 7 Drawing Sheets

METHOD OF FORMING AN HSG CAPACITOR LAYER VIA IMPLANTATION

BACKGROUND OF THE INVENTION

The present invention relates to a method of manufacturing a semiconductor device incorporating a capacitor element and the like and, more particularly, to a method of manufacturing a semiconductor device using an HSG (Hemi-Spherical-Grain) technique.

In the manufacture of dynamic random access memories (DRAMs) and the like, a higher integration degree has conventionally been required. To meet this requirement, an area necessary for each memory cell in the DRAM is greatly reduced. For example, in a 1- or 4-Mbit DRAM, a design rule using a minimum design width of 0.8 µm is employed; in a 16-Mbit DRAM, a design rule using a minimum design width of 0.6 µm is employed.

While the memory capacity increases in this manner, the semiconductor chip size cannot be increased in terms of high manufacturing efficiency and low cost. How to reduce a memory cell area is therefore an important theme in such semiconductor techniques.

A reduction in memory cell area results in a small charge storage amount. For this reason, it is becoming difficult to ensure a necessary charge amount of the memory cell along with an increase in integration degree of the memory cell. To solve this problem, memory cells having trench capacitors and stacked capacitors have conventionally been proposed and used in practical applications.

Of these memory cells, the memory cell having a stacked capacitor is advantageous in that its structure has high resistance to software errors and does not damage an Si substrate, compared to the structure of the memory cell having a trench capacitor. The memory cell structure having a stacked capacitor is expected as a next-generation memory cell structure.

The memory cell structure having a stacked capacitor is formed by an HSG technique in which a plurality of convexities are formed on the surface of a capacitor element to increase the charge storage amount.

The stacked capacitor is made up of a lower electrode, a capacitor insulating film, and an upper electrode. The lower electrode is electrically connected through a contact hole formed in an interlevel insulating film to a MOSFET (Metal Oxide Semiconductor Field Effect Transistor) formed in a semiconductor substrate. In this case, many hemispherical grains are formed on the surface of a storage electrode operating as the lower electrode of the capacitor to substantially increase the surface area of the storage electrode and obtain a large capacitance.

Several types of HSG technique are available. Of these techniques, so-called nucleation of forming nuclei by irradiation of $SiH_4$ or the like on an amorphous silicon surface and forming convexities by annealing is proposed.

Figure 4A:
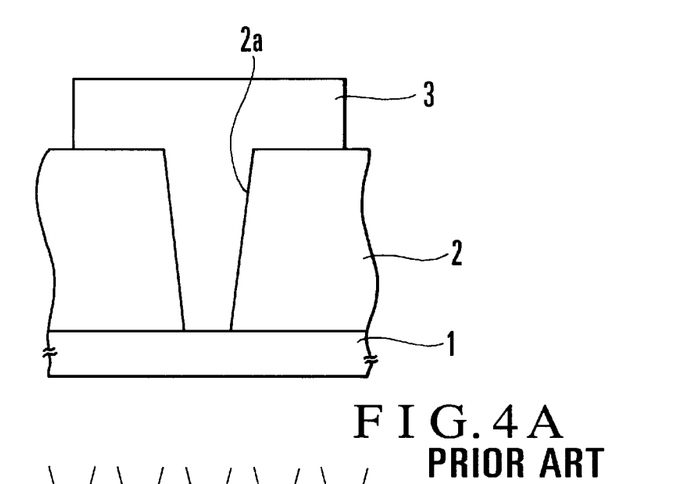
FIGS. 4A to 4C are sectional views respectively showing the steps in a method of manufacturing a conventional semiconductor device.
Figure 4B:
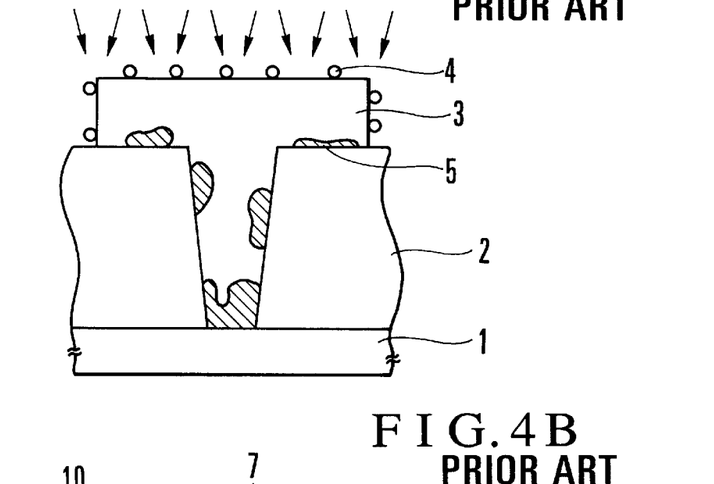
Figure 4C:
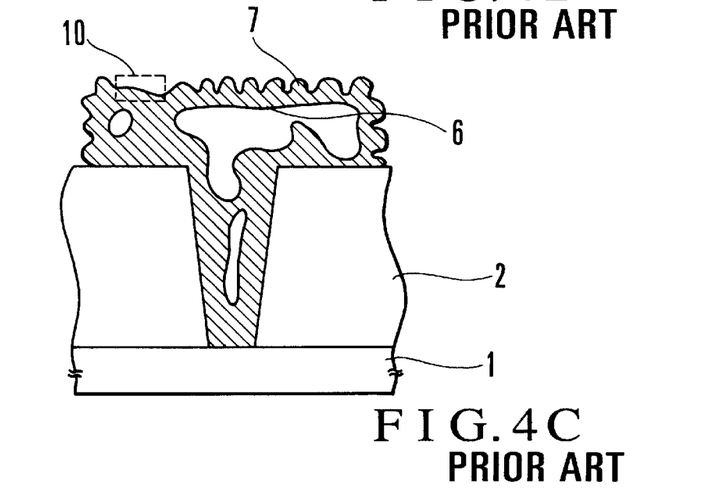

FIGS. 4A to 4C show the steps in manufacturing a capacitor element by a conventional nucleation method. As shown in FIG. 4A, after a capacitor contact hole 2a is formed in an Si oxide film 2 made of BPSG (BoroPhosphoSilicate Glass) or the like on an Si substrate 1, doped amorphous silicon containing phosphorus at a concentration of 1E20 to 1E21 $cm^{-3}$ is grown and formed into a stack shape (to be referred to as an amorphous silicon stack hereinafter) 3 by lithography and etching.

As shown in FIG. 4B, after the amorphous silicon stack 3 is cleaned to remove a native oxide film formed on its surface, the obtained structure is heated to 570° C. in an HSG processing apparatus (not shown) and irradiated with disilane ($Si_2H_6$) at 1 mTorr for 40 sec to form nuclei 4 on the surface of the amorphous silicon stack 3.

As shown in FIG. 4C, the obtained structure is annealed in a high vacuum at 570° C. for 2 min upon the irradiation of disilane, thereby forming hemispherical or mushroom-like HSG grains 7 on the surface of the amorphous silicon stack 3. By the annealing, a crystallized layer 6 is internally grown from the surface of the amorphous silicon stack 3, whereas a crystallized layer 5 is grown from the interface between the Si oxide film 2 and the amorphous silicon stack 3.

If this annealing is continuously performed, the crystallized layer 5 may reach the crystallized layer 6 before the HSG grains 7 completely grow. Once the crystallized layer 5 reaches the crystallized layer 6, subsequent HSG processing stops, and an ungrown portion 10 of the HSG grain 7 may be formed, as shown in FIG. 4C.

Figure 5A:
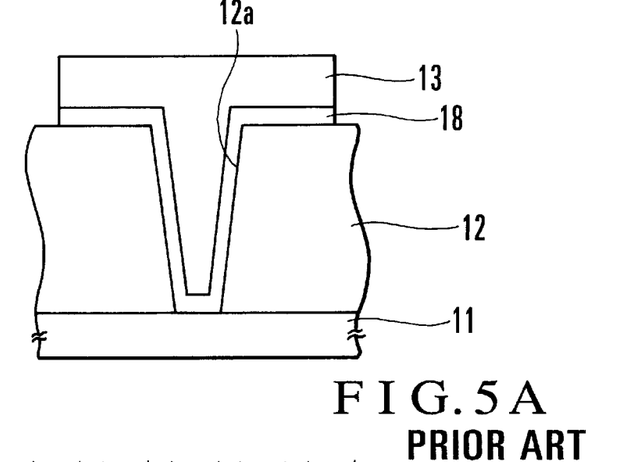
FIGS. 5A to 5C are sectional views respectively showing the steps in another method of manufacturing a conventional semiconductor device.
Figure 5B:
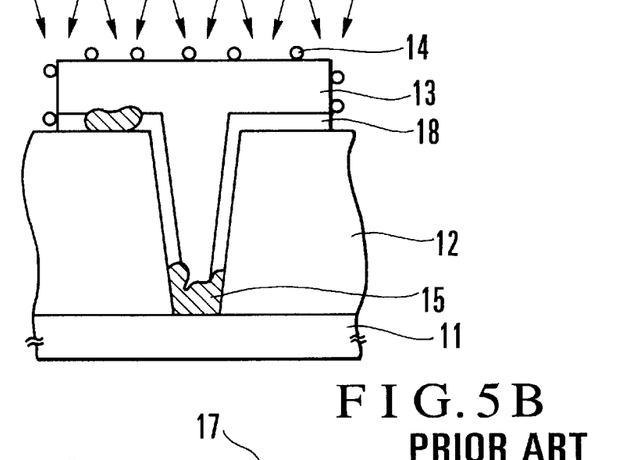
Figure 5C:
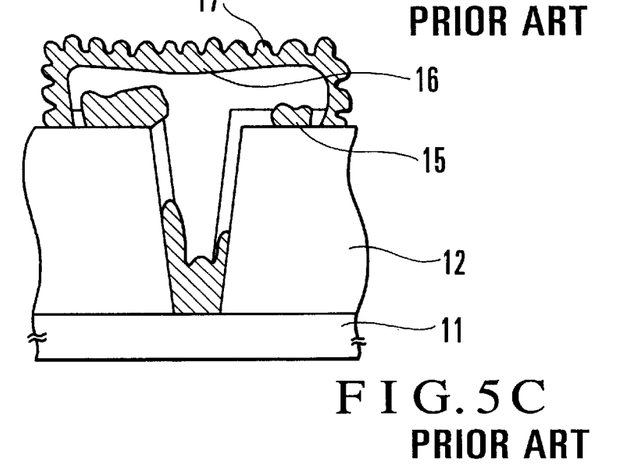

For this reason, a method of suppressing the growth of the crystallized layer 5 by forming an undoped amorphous silicon layer at the interface between the amorphous silicon stack 3 and the Si oxide film 2 has conventionally been proposed. FIGS. 5A to 5C show the steps in manufacturing a capacitor element in which an undoped amorphous silicon layer is formed at the interface.

As shown in FIG. 5A, after a capacitor contact hole 12a is formed in an Si oxide film 12 made of BPSG or the like on an Si substrate 11, an undoped amorphous silicon layer 18 is grown. Doped amorphous silicon containing phosphorus at a concentration of 1E20 to 1E21 $cm^{-3}$ is grown on the undoped amorphous silicon layer 18 and formed into an amorphous silicon stack 13 by lithography and etching.

As shown in FIG. 5B, the amorphous silicon stack 13 is cleaned to remove a native oxide film formed on its surface. Then, the obtained structure is heated to 570° C. in an HSG processing apparatus (not shown) and irradiated with disilane ($Si_2H_6$) at 1 mTorr for 40 sec to form nuclei 14 on the surface of the amorphous silicon stack 13.

As shown in FIG. 5C, the obtained structure is annealed in a high vacuum at 570° C. for 2 min upon the irradiation of disilane, thereby forming hemispherical or mushroom-like HSG grains 17 on the surface of the amorphous silicon stack 13. By the annealing, a crystallized layer 16 is internally grown from the surface of the amorphous silicon stack 13, whereas a crystallized layer 15 is grown from the interface between the Si oxide film 12 and the amorphous silicon stack 13, similar to the steps in FIGS. 4A to 4C.

Since the undoped amorphous silicon layer 18 is formed at the interface between the Si oxide film 12 and the amorphous silicon stack 13, the growth rate of the crystallized layer 15 is lower than that in the steps of FIGS. 4A to 4C. Therefore, the crystallized layer 15 does not reach the crystallized layer 16 before completion of the growth of the HSG grains 17.

According to the above conventional example, the growth of the crystallized layer can be suppressed by forming the undoped amorphous silicon layer 18. However, forming the undoped amorphous silicon layer 18 undesirably increases the contact resistance between the amorphous silicon stack 13 and the Si substrate 11.

SUMMARY OF THE INVENTION

It is an object of the present invention to provide a semiconductor device manufacturing method of suppressing the growth of a crystallized layer and efficiently forming convexities on the surface of an amorphous silicon layer.

It is another object of the present invention to provide a semiconductor device manufacturing method capable of suppressing the contact resistance, thereby keeping it low.

In order to achieve the above objects, according to the present invention, there is provided a method of manufacturing a semiconductor device, comprising the steps of forming an amorphous silicon layer with a predetermined thickness to be electrically connected to a silicon substrate, on a silicon oxide film formed on the silicon substrate, mixing an interface between the silicon oxide film and the amorphous silicon layer by implanting ions through the amorphous silicon layer, forming a nucleus on a surface of the amorphous silicon layer by annealing of the amorphous silicon layer and irradiation of a predetermined material, and forming a convexity on the surface of the amorphous silicon layer using the nucleus as a center by annealing the amorphous silicon layer having the nucleus.

DESCRIPTION OF THE PREFERRED EMBODIMENTS

The present invention will be described in detail below with reference to the accompanying drawings.

Figure 1A:
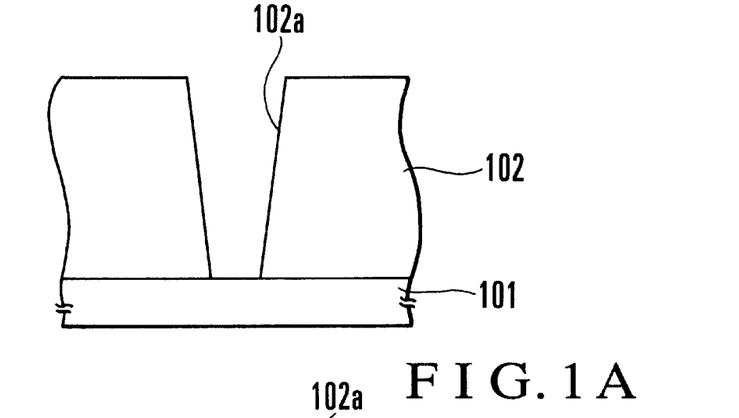
FIGS. 1A to 1F are sectional views respectively showing the steps in a method of manufacturing a semiconductor device according to the first embodiment of the present invention.
Figure 1B:
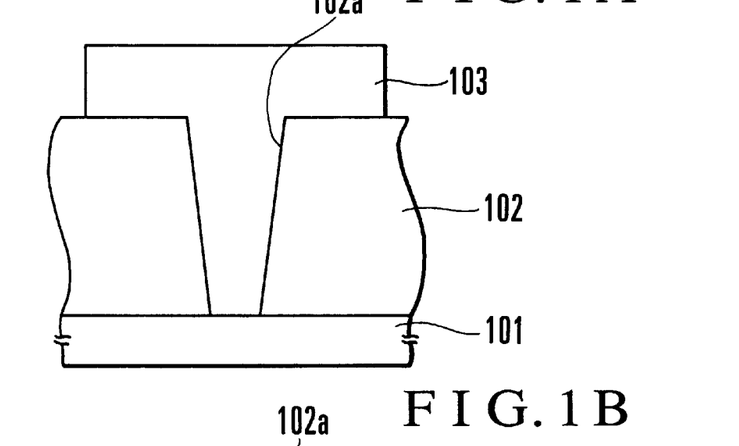

FIGS. 1A to 1F show the steps in manufacturing a DRAM according to the first embodiment of the present invention. Referring to FIG. 1A, a capacitor contact hole 102a is formed in an Si oxide film 102 made of BPSG or the like on an Si substrate 101 so as to reach the Si substrate 101. As shown in FIG. 1B, an amorphous silicon stack 103 having a height of, e.g., 300 nm is formed above the capacitor contact hole 102a and on its peripheral portion. At this time, the amorphous silicon stack 103 is also buried in the capacitor contact hole 102a.

Figure 1C:
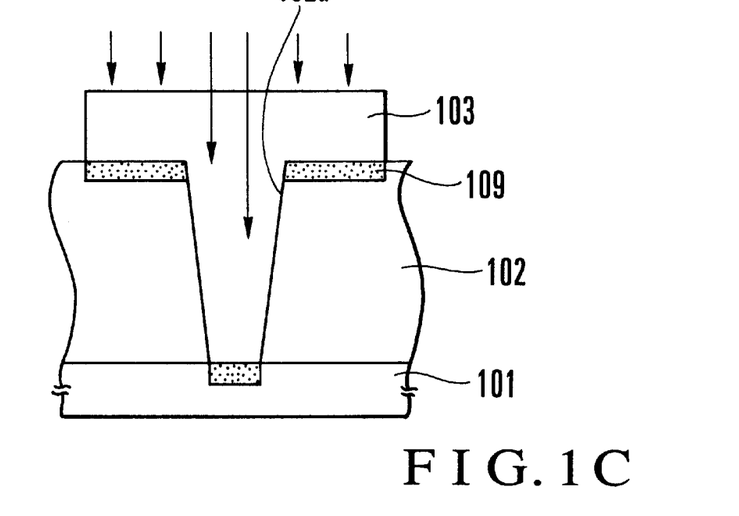

As shown in FIG. 1C, Si or Ar ions are implanted in a portion near the interface between the amorphous silicon stack 103 and the Si oxide film 102 to mix this interface. As a result, ion-implanted layers 109 are formed on the surface of the Si substrate 101 exposing at the bottom of the capacitor contact hole 102a and the surface of the Si oxide film 102 around the capacitor contact hole 102a.

Figure 1D:
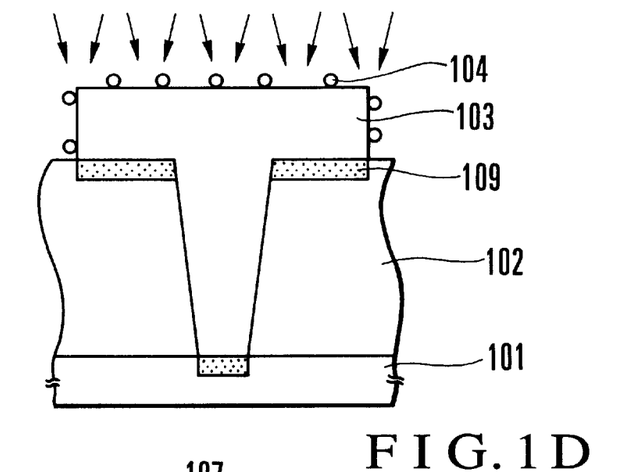

As shown in FIG. 1D, the amorphous silicon stack 103 is cleaned with HF (hydrogen fluoride) or the like to remove a native oxide film formed on its surface. After that, the obtained structure is heated to 550 to 570° C. (preferably 570° C.) in an HSG processing apparatus (not shown) and irradiated with disilane ($Si_2H_6$) at 1 mTorr for 40 sec to form HSG nuclei 104 on the amorphous silicon stack 103. In the first embodiment, the thickness of the Si oxide film 102 is 600 nm, the opening diameter of the capacitor contact hole 102a is 400 nm, and the diameter of the bottom surface is 200 nm.

Figure 1E:
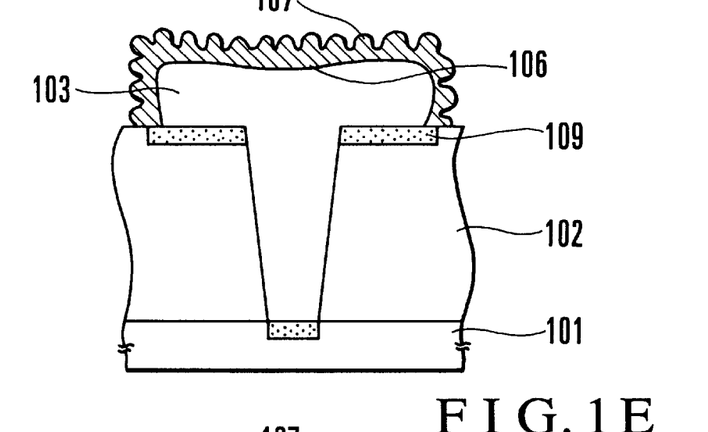

As shown in FIG. 1E, the temperature inside the HSG processing apparatus is increased to 850° C. to anneal the obtained structure for 30 min. As a result, many hemispherical or mushroom-like convexities, i.e., many HSG grains 107 using the nuclei 104 as centers are formed on the surface of the amorphous silicon stack 103.

Figure 1F:
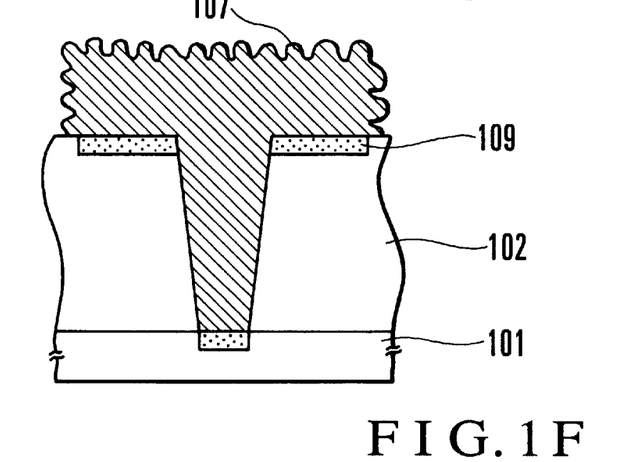

As shown in FIG. 1F, the entire amorphous silicon stack 103 is crystallized as a result of the annealing, and ions within the ion-implanted layer 109 are diffused to the amorphous silicon stack 103 to decrease the contact resistance.

FIGS. 2A to 2G show the steps in manufacturing a semiconductor device according to the second embodiment of the present invention.

Figure 2A:
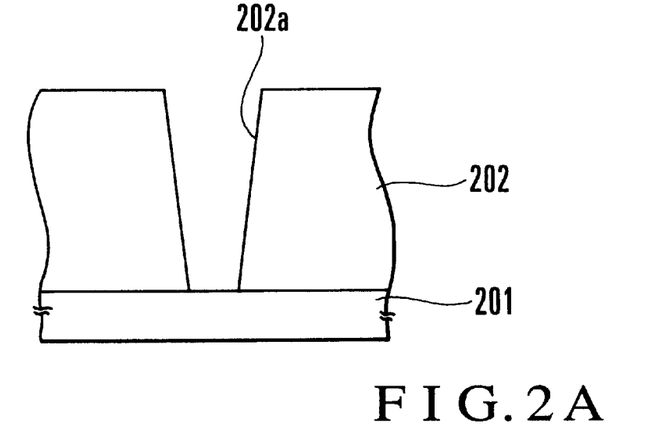
FIGS. 2A to 2G are sectional views respectively showing the steps in a method of manufacturing a semiconductor device according to the second embodiment of the present invention.
Figure 2B:
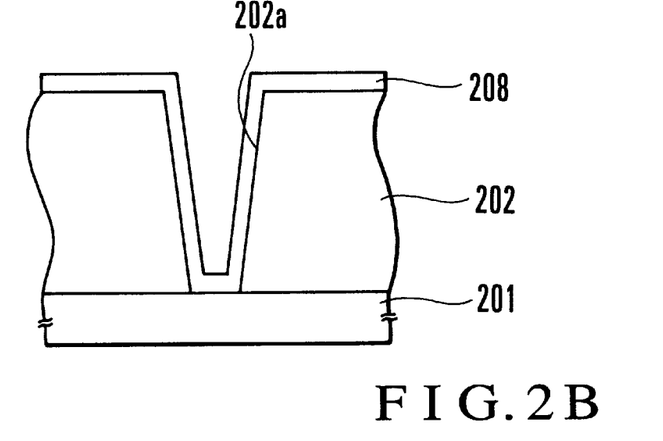

As shown in FIG. 2A, a capacitor contact hole 202a is formed in an Si oxide film 202 made of BPSG or the like so as to reach an Si substrate 201. As shown in FIG. 2B, an undoped amorphous silicon layer 208 is grown to a thickness of 30 to 50 nm on the wall inside the capacitor contact hole 202a and the peripheral portion.

Figure 2C:
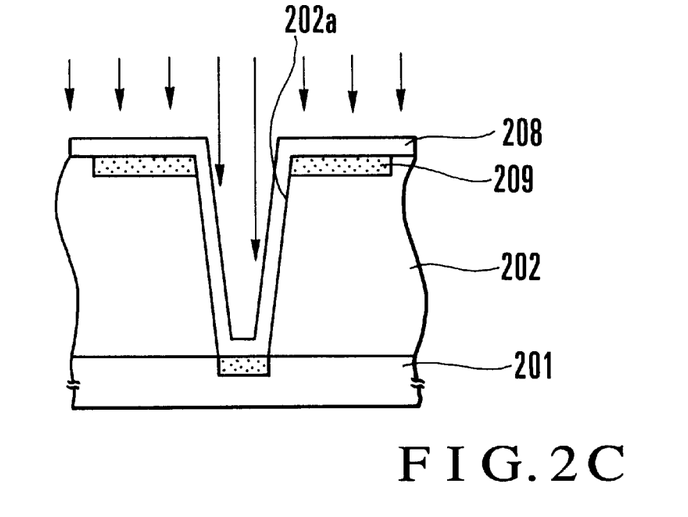

As shown in FIG. 2C, As or P ions are implanted to a position slightly deeper than the interface of the undoped amorphous silicon layer 208 to mix the interface. As a result, ion-implanted layers 209 are formed on the Si substrate 201 exposing at the bottom of the capacitor contact hole 202a and the surface of the Si oxide film 202 around the capacitor contact hole 202a.

Figure 2D:
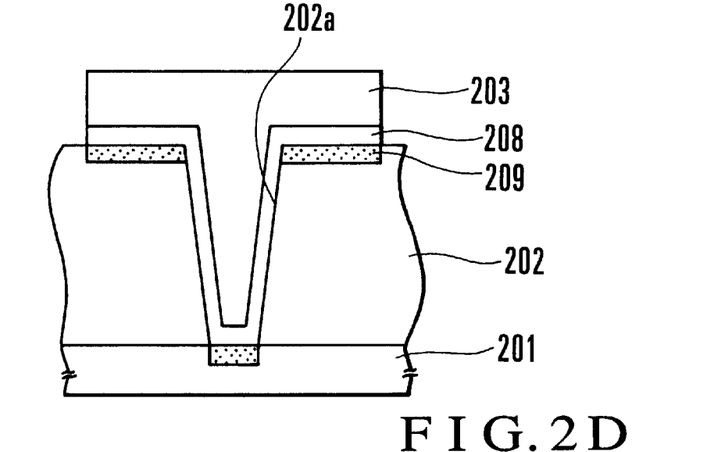

As shown in FIG. 2D, doped amorphous silicon 203 containing phosphorus at a concentration of 1E20 to 1E21 $cm^{-3}$ is grown above the capacitor contact hole 202a and on its peripheral portion. At this time, the doped amorphous silicon 203 is also buried in the capacitor contact hole 202a. Thereafter, the doped amorphous silicon 203 is formed into a stack shape by lithography and etching. In the second embodiment, the thickness of the Si oxide film 202 is 600 nm, the opening diameter of the capacitor contact hole 202a is 400 nm, and the diameter of the bottom surface is 200 nm.

Figure 2E:
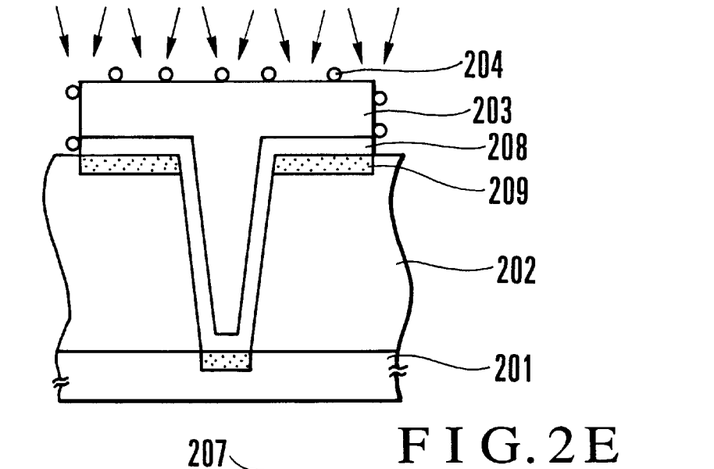

As shown in FIG. 2E, the amorphous silicon stack 203 is cleaned with HF or the like to remove a native oxide film formed on its surface. Then, the obtained structure is heated to 550 to 570° C. (preferably 570° C.) in an HSG processing apparatus (not shown) and irradiated with disilane ($Si_2H_6$) at 1 mTorr for 40 sec to form HSG nuclei 204 on the amorphous silicon stack 203.

Figure 2F:
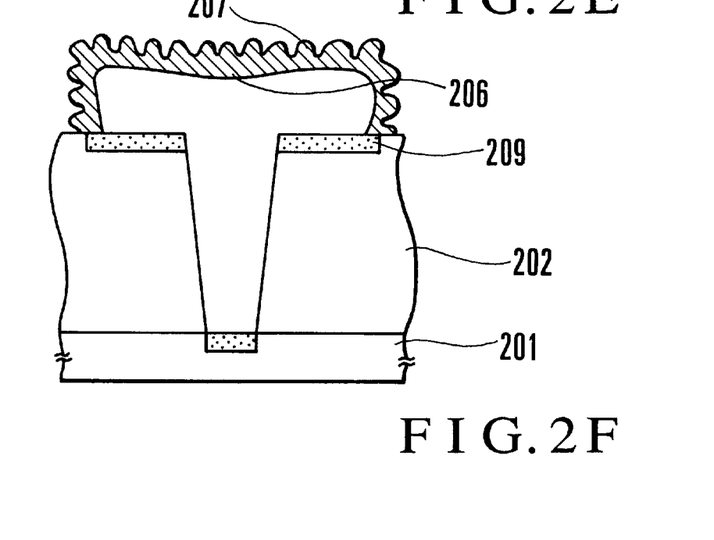

As shown in FIG. 2F, the temperature inside the HSG processing apparatus is increased to 850° C. to anneal the obtained structure for 30 min. As a result, many hemispherical or mushroom-like convexities, i.e., many HSG grains 207 using the nuclei 204 as centers are formed on the surface of the amorphous silicon stack 203.

Figure 2G:
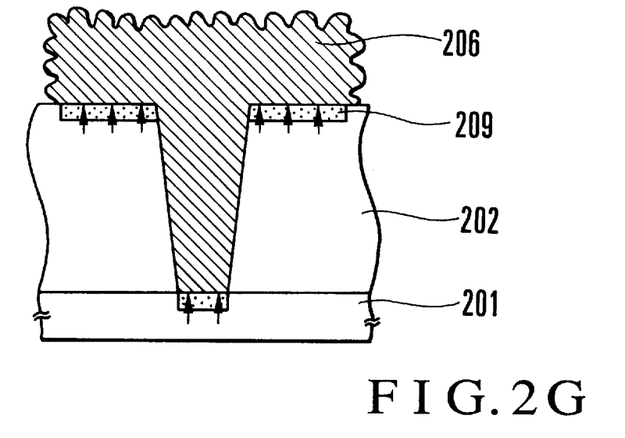

As shown in FIG. 2G, ions (As or P) within the ion-implanted layer 209 are diffused from the ion-implanted layer 209 to the undoped amorphous silicon layer 208 as a result of the annealing for 30 min to decrease the contact resistance. Note that the entire stack is converted to polysilicon as a result of the annealing.

Although the implanted-ion species is not particularly limited, the mixing effect of a small-mass element such as H or He is small at the interface. An element exhibiting the same conductivity type as that of a dopant contained in the amorphous silicon stack 103 or 203 yields not only the interface mixing effect but also a decrease in contact resistance.

In the use of As or P, the following setting is preferable in order to meet two conditions:

I. The ion concentration at the interface of the Si oxide film 102 or 202 is set to 1E20 cm$^{-3}$ or less.

II. Ions are diffused to the amorphous silicon stack 103 or 203 by subsequent annealing.

Figure 3A:
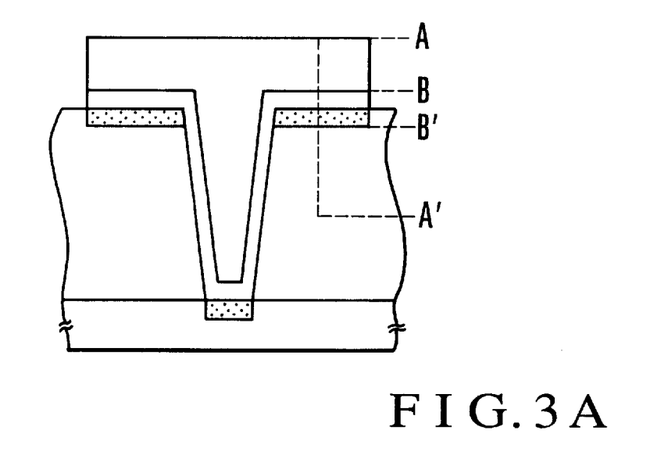
FIGS. 3A and 3B is a sectional view and a graph respectively showing the relationship between the protected range and the ion concentration.
Figure 3B:
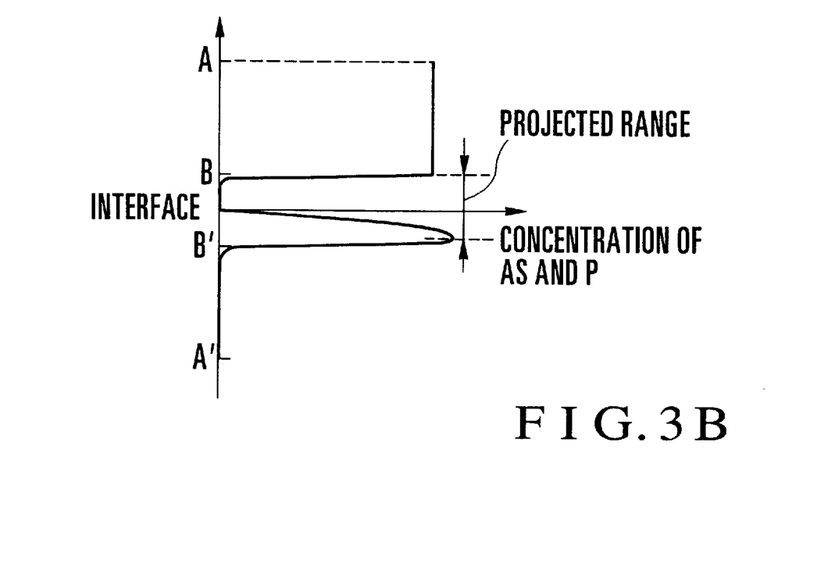

More specifically, for a film thickness of 30 nm, the implantation energy of As is set to 100 to 250 keV, or that of P is set to 50 to 100 keV in order to obtain a projected range 2 to 4 times the film thickness. For example, the projected range and the concentration of implanted ions have a relationship shown in FIGS. 3A and 3B. Note that when the implanted species is not used as a dopant, i, e., Si or Ar is used as a dopant, As or P ions may be implanted with a projected range 1 to 4 times the film thickness. The dose is preferably 5E14 to 2E16 cm in order to obtain a satisfactory mixing effect.

The above embodiments have exemplified the method of manufacturing a capacitor element in a DRAM. The present invention is not limited to the DRAM and is applicable to surface processing to a floating gate and the like in an EPROM (Electrically Programmable ROM) and an EEPROM (Electrically Erasable Programmable ROM).

As has been described above, according to the present invention, since ions are implanted at the interface between the amorphous silicon layer and the oxide film to mix the interface, the growth of the crystallized layer in the amorphous silicon layer can be suppressed. In addition, convexities can be efficiently grown, and the contact resistance can be suppressed low.

What is claimed is:

1. A method of manufacturing a semiconductor device, comprising the steps of:

forming an amorphous silicon layer to be electrically connected to a silicon substrate, on a silicon oxide film formed on said silicon substrate;

mixing an interface between said silicon oxide film and said amorphous silicon layer by implanting ions through said amorphous silicon layer;

forming a nucleus on a surface of said amorphous silicon layer by annealing of said amorphous silicon layer and irradiation of a predetermined material; and forming a convexity on said surface of said amorphous silicon layer using said nucleus as a center by annealing said amorphous silicon layer having said nucleus.

2. A method according to claim 1, wherein the step of forming said amorphous silicon layer comprises the step of:

directly forming a doped amorphous silicon layer to be electrically connected to said silicon substrate, on said silicon oxide film formed on said silicon substrate, and the step of mixing the interface comprises the step of:

mixing the interface between said silicon oxide film and said doped amorphous silicon layer by implanting ions through said doped amorphous silicon layer.

3. A method according to claim 1, wherein the step of forming said amorphous silicon layer comprises the steps of:

directly forming an undoped amorphous silicon layer to be electrically connected to said silicon substrate, on said silicon oxide film; and forming a doped amorphous silicon layer on said undoped amorphous silicon layer, and the step of mixing the interface comprises the step of:

mixing the interface between said silicons oxide film and said undoped amorphous silicon layer by implanting ions through said undoped amorphous silicon layer.

4. A method according to claim 1, wherein the step of forming said amorphous silicon layer comprises the steps of:

forming a contact hole in said silicon oxide film so as to reach said silicon substrate; and forming said amorphous silicon layer above said contact hole and on said silicon oxide film around the contact hole.

5. A method according to claim 4, wherein the step of mixing the interface comprises the step of:

forming an ion-implanted layer on a surface of said silicon substrate exposed at a bottom of the contact hole by implanting ions through said amorphous silicon layer.

6. A method according to claim 1, wherein the convexity formed on said surface of said amorphous silicon layer has one of a hemispherical shape and a mushroom-like shape.

7. A method according to claim 1, wherein the implanted ion is one of an arsenic ion and a phosphorus ion.

8. A method according to claim 7, wherein the ions are implanted at such an energy as to obtain a projected range 2 to 4 times a film thickness.

9. A method according to claim 1, wherein the implanted ion is one of a silicon ion and an argon ion.

10. A method according to claim 9, wherein the ions are implanted at such an energy as to obtain a projected range 1 to 4 times a film thickness.

11. A method according to claim 1, wherein the step of forming the nucleus comprises the step of:

heating said amorphous silicon layer to 550 to 570° C.

12. A method according to claim 3, wherein said undoped amorphous silicon layer is formed to a thickness of 30 to 50 nm.

13. A method according to claim 2, wherein said doped amorphous silicon layer contains one of arsenic and phosphorus at 1E20 to 1E21 cm$^{-3}$.

14. A method according to claim 3, wherein said doped amorphous silicon layer contains one of arsenic and phosphorus at 1E20 to 1E21 cm$^{-3}$.

* * * * *

UNITED STATES PATENT AND TRADEMARK OFFICE
CERTIFICATE OF CORRECTION

PATENT NO.: 6,090,681
DATED: July 18, 2000
INVENTOR(S): Ichiro YAMAMOTO

It is certified that error(s) appears in the above-identified patent and that said Letters Patent is hereby corrected as shown below:

Column 5, line 21, after "2E16" insert -- $^{-2}$ --.

Signed and Sealed this

Seventeenth Day of April, 2001

NICHOLAS P. GODICI

*Attest:*

*Attesting Officer*       *Acting Director of the United States Patent and Trademark Office*